(12) United States Patent
He et al.

(10) Patent No.: US 8,944,002 B2
(45) Date of Patent: Feb. 3, 2015

(54) HIGH THROUGHPUT PHYSICAL VAPOR DEPOSITION SYSTEM FOR MATERIAL COMBINATORIAL STUDIES

(75) Inventors: Ting He, Dublin, OH (US); Eric R. Kreidler, Pickerington, OH (US); Tadashi Nomura, Dublin, OH (US)

(73) Assignee: Honda Motor Co., Ltd., Tokyo (JP)

( * ) Notice: Subject to any disclaimer, the term of this patent is extended or adjusted under 35 U.S.C. 154(b) by 936 days.

(21) Appl. No.: 10/757,302

(22) Filed: Jan. 14, 2004

(65) Prior Publication Data

US 2005/0150760 A1 Jul. 14, 2005

(51) Int. Cl.
- *C23C 16/00* (2006.01)
- *C23C 14/04* (2006.01)
- *C23C 14/54* (2006.01)
- *C23C 14/50* (2006.01)

(52) U.S. Cl.
CPC .............. *C23C 14/50* (2013.01); *C23C 14/042* (2013.01); *C23C 14/548* (2013.01)
USPC ...................................... 118/723 FI; 118/729

(58) Field of Classification Search
USPC .......... 118/313, 314, 315, 723 R, 723 FI, 729
See application file for complete search history.

(56) References Cited

U.S. PATENT DOCUMENTS

| | | | | |
|---|---|---|---|---|
| 4,153,529 A * | 5/1979 | Little et al. | .................. | 204/192.3 |
| 4,596,645 A * | 6/1986 | Stirn | ......................... | 204/192.25 |
| 4,687,939 A * | 8/1987 | Miyauchi et al. | ........... | 250/492.2 |
| 4,833,101 A * | 5/1989 | Fujii | .............................. | 117/105 |
| 5,421,973 A * | 6/1995 | Koo et al. | ................. | 204/192.15 |
| 6,045,671 A * | 4/2000 | Wu et al. | .................... | 204/298.11 |
| 6,312,525 B1 * | 11/2001 | Bright et al. | ................... | 118/719 |
| 6,364,956 B1 * | 4/2002 | Wang et al. | .................... | 118/726 |
| 6,491,967 B1 * | 12/2002 | Corderman et al. | .............. | 427/8 |
| 6,996,550 B2 * | 2/2006 | Wang et al. | ...................... | 706/19 |
| 7,544,574 B2 * | 6/2009 | Chiang et al. | ................. | 438/297 |
| 2002/0000779 A1 * | 1/2002 | Anders | ...................... | 315/111.21 |
| 2003/0082587 A1 * | 5/2003 | Seul et al. | .......................... | 435/6 |
| 2003/0190408 A1 | 10/2003 | Moini et al. | | |
| 2004/0036032 A1 * | 2/2004 | Leung et al. | ............... | 250/423 R |
| 2004/0086633 A1 * | 5/2004 | Lemmon et al. | .............. | 427/115 |
| 2005/0035002 A1 * | 2/2005 | Wang et al. | .................... | 205/775 |

FOREIGN PATENT DOCUMENTS

WO 02/24321 3/2002

* cited by examiner

*Primary Examiner* — Keath Chen
(74) *Attorney, Agent, or Firm* — Mark E. Duell

(57) ABSTRACT

An infinitely variable physical vapor deposition matrix system that allows the synthesis of multiple combinatorial catalyst samples at essentially the same time, by the co-deposition of multiple materials, or the sequential layer by layer deposition of multiple catalyst constituents, or both, such that the optimum mix of materials for a pre-determined application can be experimentally determined in subsequent testing. The discovery of optimal catalyst combinations for utilization in specified reactions and devices is facilitated. The high throughput system reduces the time and complexity of processing typically required to formulate and test combinatorial catalyst materials.

18 Claims, 13 Drawing Sheets

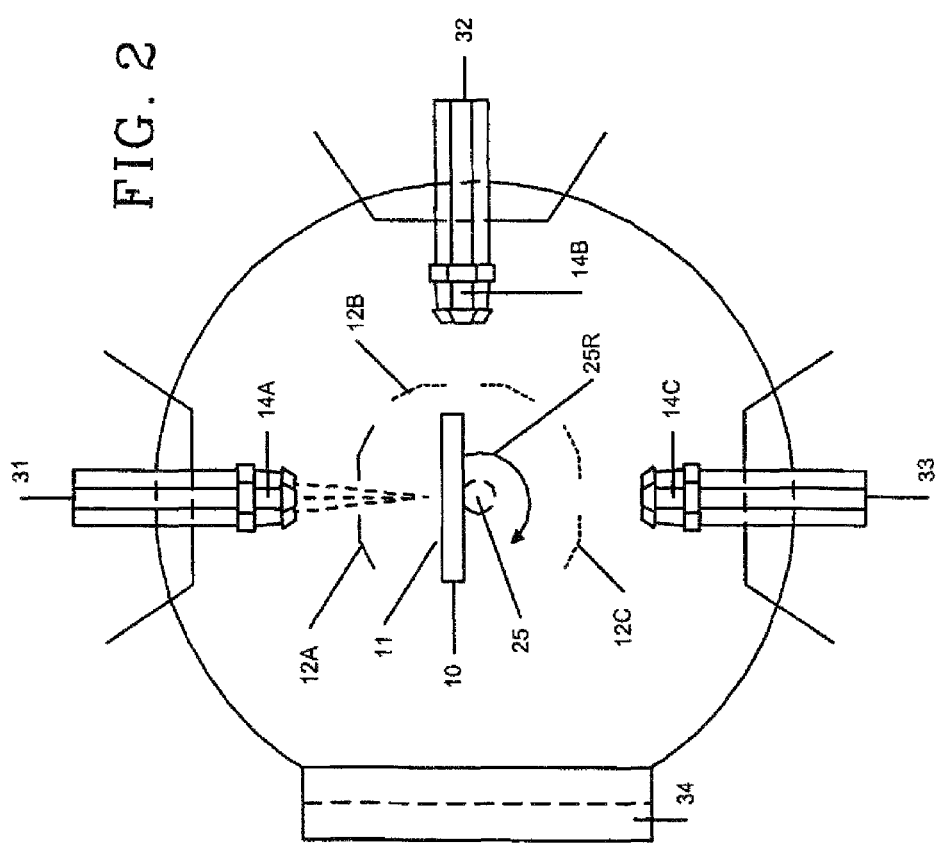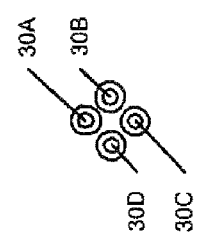

| Substrate Position # | # of Cycles | Step # | Cluster # | Gas Pressure | Deposition Delay | Deposition Time | M11 | M12 | M13 | M14 | M21 | M22 | M23 | M24 | M31 | M32 | M33 | M34 |
|---|---|---|---|---|---|---|---|---|---|---|---|---|---|---|---|---|---|---|
| 11 | 1 | 1 | 1 | 10 | 45 | 1200 | 300 | 0 | 0 | 0 | 0 | 0 | 0 | 0 | 0 | 0 | 0 | 0 |
| 11 | 1 | 1 | 2 | 10 | 45 | 900 | 0 | 0 | 0 | 0 | 0 | 150 | 0 | 0 | 0 | 0 | 0 | 0 |
| 11 | 1 | 1 | 3 | 10 | 45 | 500 | 0 | 0 | 0 | 0 | 0 | 0 | 0 | 0 | 0 | 0 | 75 | 0 |
| 35 | 2 | 1 | 1 | 10 | 45 | 600 | 50 | 0 | 240 | 25 | 0 | 0 | 0 | 0 | 0 | 0 | 0 | 0 |
| 35 | 2 | 2 | 1 | 7.5 | 45 | 2400 | 0 | 0 | 0 | 0 | 500 | 211 | 67 | 0 | 0 | 0 | 0 | 0 |
| 87 | 9 | 1 | 2 | 7.5 | 45 | 15 | 0 | 0 | 0 | 0 | 89 | 244 | 0 | 0 | 0 | 0 | 0 | 0 |
| 87 | 9 | 2 | 2 | 7.5 | 45 | 60 | 0 | 0 | 0 | 0 | 50 | 0 | 0 | 90 | 0 | 0 | 0 | 0 |
| 87 | 9 | 3 | 2 | 7.5 | 45 | 88 | 0 | 0 | 0 | 0 | 99 | 46 | 79 | 34 | 0 | 0 | 0 | 0 |
| 87 | 9 | 4 | 3 | 5 | 45 | 100 | 0 | 0 | 0 | 0 | 0 | 0 | 0 | 0 | 100 | 25 | 0 | 75 |
| 87 | 9 | 5 | 1 | 5 | 45 | 400 | 100 | 0 | 0 | 0 | 0 | 0 | 0 | 0 | 0 | 0 | 0 | 0 |
| 87 | 9 | 6 | 2 | 5 | 45 | 300 | 0 | 0 | 0 | 0 | 0 | 68 | 0 | 0 | 50 | 75 | 100 | 25 |
| 87 | 9 | 7 | 3 | 5 | 45 | 300 | 0 | 0 | 0 | 0 | 0 | 0 | 0 | 0 | 50 | 0 | 0 | 0 |
| 87 | 9 | 8 | 1 | 5 | 45 | 500 | 0 | 89 | 134 | 0 | 34 | 76 | 0 | 89 | 0 | 0 | 0 | 0 |
| 87 | 9 | 9 | 2 | 10 | 45 | 300 | 0 | 0 | 0 | 0 | 0 | 0 | 0 | 0 | 60 | 50 | 50 | 50 |
| 44 | 2 | 1 | 3 | 10 | 45 | 100 | 120 | 34 | 90 | 399 | 0 | 0 | 0 | 0 | 0 | 0 | 0 | 0 |
| 44 | 2 | 2 | 1 | 7.5 | 45 | 60 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 | 0 |

FIG. 10

| Substrate Position # | # of Cycles | Step # | Cluster # | Gas Pressure | Deposition Delay | Deposition Time | M11 | M12 | M13 | M14 | M21 | M22 | M23 | M24 | M31 | M32 | M33 | M34 |
|---|---|---|---|---|---|---|---|---|---|---|---|---|---|---|---|---|---|---|
| 11 | 1 | 1 | 1 | 10 | 45 | 1200 | 300 | 200 | 0 | 0 | 0 | 0 | 0 | 0 | 0 | 0 | 0 | 0 |
| 12 | 1 | 1 | 1 | 10 | 45 | 900 | 235 | 100 | 0 | 45 | 0 | 0 | 0 | 0 | 0 | 0 | 0 | 0 |
| 13 | 1 | 1 | 1 | 10 | 45 | 500 | 333 | 120 | 90 | 450 | 0 | 0 | 0 | 0 | 0 | 0 | 0 | 0 |
| 14 | 1 | 1 | 1 | 10 | 45 | 600 | 50 | 0 | 240 | 25 | 0 | 0 | 0 | 0 | 0 | 0 | 0 | 0 |
| 21 | 1 | 1 | 2 | 7.5 | 45 | 2400 | 0 | 0 | 0 | 0 | 500 | 211 | 67 | 0 | 0 | 0 | 0 | 0 |
| 22 | 1 | 1 | 2 | 7.5 | 45 | 15 | 0 | 0 | 0 | 0 | 89 | 244 | 0 | 0 | 0 | 0 | 0 | 0 |
| 23 | 1 | 1 | 2 | 7.5 | 45 | 60 | 0 | 0 | 0 | 0 | 50 | 0 | 79 | 90 | 0 | 0 | 0 | 0 |
| 24 | 1 | 1 | 2 | 7.5 | 45 | 88 | 0 | 0 | 0 | 0 | 99 | 46 | 0 | 34 | 0 | 0 | 0 | 0 |
| 31 | 1 | 1 | 3 | 5 | 45 | 100 | 0 | 0 | 0 | 0 | 0 | 0 | 0 | 0 | 100 | 25 | 50 | 75 |
| 32 | 1 | 1 | 3 | 5 | 45 | 400 | 0 | 0 | 0 | 0 | 0 | 0 | 0 | 0 | 75 | 50 | 25 | 100 |
| 33 | 1 | 1 | 3 | 5 | 45 | 300 | 0 | 0 | 0 | 0 | 0 | 0 | 0 | 0 | 50 | 75 | 100 | 25 |
| 34 | 1 | 1 | 3 | 5 | 45 | 300 | 0 | 0 | 134 | 0 | 0 | 0 | 0 | 0 | 25 | 100 | 75 | 50 |
| 41 | 1 | 1 | 1 | 5 | 45 | 600 | 0 | 89 | 0 | 0 | 34 | 78 | 0 | 89 | 0 | 0 | 0 | 0 |
| 42 | 1 | 1 | 2 | 5 | 45 | 300 | 0 | 0 | 0 | 0 | 0 | 0 | 0 | 0 | 50 | 50 | 50 | 50 |
| 43 | 1 | 1 | 3 | 5 | 45 | 100 | 120 | 34 | 90 | 389 | 0 | 0 | 0 | 0 | 0 | 0 | 0 | 0 |
| 44 | 1 | 1 | 1 | 5 | 45 | 60 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 | 0 |

FIG. 11

| Composition (atomic ratio) | | | Experimental Single Gun Rate (A/s*W) | | | Total Power (W) | Total Rate (A/s) | Calibration Factor | | | Calibrated Deposition Power (W) | | |
|---|---|---|---|---|---|---|---|---|---|---|---|---|---|
| Pt | W | V | Pt | W | V | PtWV | PtWV | Pt | W | V | Pt | W | V |
| 60 | 20 | 20 | 1.16E-02 | 1.10E-02 | 5.26E-03 | 2.00E+02 | 1.87 | 0.794 | 1.058 | 1.077 | 77 | 37 | 70 |
| 40 | 20 | 40 | 1.16E-02 | 1.10E-02 | 5.26E-03 | 2.00E+02 | 1.58 | 0.794 | 1.058 | 1.077 | 44 | 31 | 120 |
| 40 | 40 | 20 | 1.16E-02 | 1.10E-02 | 5.26E-03 | 2.00E+02 | 1.86 | 0.794 | 1.058 | 1.077 | 51 | 72 | 89 |
| 20 | 60 | 20 | 1.16E-02 | 1.10E-02 | 5.26E-03 | 2.00E+02 | 1.85 | 0.794 | 1.058 | 1.077 | 25 | 107 | 68 |
| 20 | 40 | 40 | 1.16E-02 | 1.10E-02 | 5.26E-03 | 2.00E+02 | 1.57 | 0.794 | 1.058 | 1.077 | 22 | 62 | 118 |
| 20 | 20 | 60 | 1.16E-02 | 1.10E-02 | 5.26E-03 | 2.00E+02 | 1.36 | 0.794 | 1.058 | 1.077 | 19 | 27 | 156 |
| | | | Calibration Processes | | | | | | | | Deposition Parameters | | |

FIG. 12

EDAX Analysis of Films

| Alloy | Power Watts | Composition Pt | Composition W | Composition V | EDAX Composition Pt | EDAX Composition W | EDAX Composition V | Comments |
|---|---|---|---|---|---|---|---|---|
| 1 | 100 | 60.0% | 20.0% | 20.0% | 61.2% | 17.1% | 20.7% | Reasonable Agreement |
| 1 | 200 | 60.0% | 20.0% | 20.0% | 61.4% | 17.3% | 21.4% | Reasonable Agreement |
| 2 | 100 | 40.0% | 20.0% | 40.0% | 42.7% | 19.0% | 38.3% | Reasonable Agreement |
| 2 | 200 | 40.0% | 20.0% | 40.0% | 41.6% | 19.0% | 39.4% | Reasonable Agreement |
| 3 | 100 | 40.0% | 40.0% | 20.0% | 45.4% | 35.5% | 19.1% | Fair Agreement - within limits of EDAX |
| 3 | 200 | 40.0% | 40.0% | 20.0% | 49.7% | 27.2% | 23.2% | Poor Agreement - may be issue of background subtraction |
| 4 | 100 | 20.0% | 60.0% | 20.0% | 21.8% | 55.9% | 22.4% | Reasonable Agreement |
| 4 | 200 | 20.0% | 60.0% | 20.0% | 24.2% | 49.3% | 26.8% | Poor Agreement - definite issues with background subtraction |
| 5 | 100 | 20.0% | 40.0% | 40.0% | 16.5% | 40.8% | 42.7% | Reasonable Agreement |
| 5 | 200 | 20.0% | 40.0% | 40.0% | 25.7% | 34.4% | 39.8% | Fair Agreement - within limits of EDAX |
| 6 | 100 | 20.0% | 40.0% | 40.0% | 18.3% | 22.0% | 59.8% | Reasonable Agreement |
| 6 | 200 | 20.0% | 20.0% | 60.0% | 23.0% | 20.4% | 56.6% | Reasonable Agreement |

HIGH THROUGHPUT PHYSICAL VAPOR DEPOSITION SYSTEM FOR MATERIAL COMBINATORIAL STUDIES

FIELD OF THE INVENTION

The present invention relates to systems and methods for the synthesis of heterogeneous catalysts and materials by the combinatorial method for catalyst and materials discovery. A high throughput system is provided that reduces the time and complexity of producing the large number of different materials that are typically required in the combinatorial discovery process.

BACKGROUND AND SUMMARY OF THE INVENTION

The discovery of catalyst material compositions from among almost limitless material or compositional possibilities, layer configurations, and material proportions has typically required the one by one fabrication of a sample on a specified substrate, followed by the proper testing—typically a very time consuming process. In the prior art, when physical vapor deposition (PVD) processes are used in the synthesis of catalytic samples, one by one, for testing, expensive and complex equipment and repetitive test protocols are involved that consume considerable time. In the system of the present invention, a high throughput system for synthesizing a group of catalyst compositions at the same time (namely in a same batch) for subsequent testing is provided.

In the case of coating a material using a PVD system, it is often required that the targets of the plasma guns be exchanged frequently—a time consuming procedure when hundreds, or thousands, of discrete, individual material combinations are to be tested for suitability. The invention of the system described herein allows multiple different samples to be created in batches and expedites the preparation and testing of sample materials that are theoretically or empirically identified as candidates for practical use in specified potential applications. For example, in combination with a multi-channel rotating disk electrode assembly, suitable electrocatalysts for a predetermined application may be synthesized, evaluated and consequently discovered.

As referred to herein, high throughput catalyst discovery refers to the methodology of creating at the same time a large number of chemical compositions that are subsequently tested and/or evaluated for use in a specified process environment in which a catalyst is intended to be operative. In the conventional catalyst discovery process, each individual compound is separately created and tested. In the high throughput/combinatorial studies to which the present application is directed, the deposit of different varieties of functional materials or chemical compositions, on different defined areas of a single substrate, or on an assembled combination of a large number of separate substrate samples, allows the different deposited materials to be synthesized, essentially simultaneously, together. Thus, using the system of the invention, it is possible to produce hundreds, or even thousands, of potential catalyst composition samples during a working day.

Typically, the discovery of a catalyst that is suitable for a particular application (determined by factors of efficiency, economy, size, and ease of synthesis, among others) is frequently a trial and error procedure, which in the instance of PVD procedures, is further complicated because the catalyst may be a co-deposition or multi-layered composition formed from multiple constituents. Numerous combinations of materials, proportions, mixtures layers and other factors are possible. Constituent materials are selected; their order in layers is determined; their co-deposition component percentages, if applicable, are estimated; and the resulting catalyst is then synthesized and subsequently evaluated for suitability for a specific application.

There exists a need for a high throughput system for efficiently synthesizing multiple variations of different catalyst compositions for testing. Thus, it is an object of this invention to provide an infinitely variable, programmable PVD plasma gun cluster and matrix system to allow the essentially simultaneous fabrication of multiple, different combinatorial catalyst samples in a batch, by the co-deposition of multiple materials or the sequential layer by layer deposition of multiple catalyst constituents, for testing. The optimum mix of materials, within the range of the multiple batch samples produced, for a pre-specified application, can be determined in subsequent testing.

The invention is described more fully in the following description of the preferred embodiment considered in view of the drawings in which:

BRIEF DESCRIPTION OF THE SEVERAL VIEWS OF THE DRAWINGS

FIG. 2 is a top view of a PVD chamber having three plasma gun clusters radially arranged around a perimeter with respect to a centrally disposed and controllable substrate assembly within the chamber to which the guns are focused.

FIG. 3 is a front view of a multiple plasma gun cluster such as shown in FIG. 2 that is focused toward the substrate assembly in the PVD chamber.

FIG. 8A is a partial view of programming matrix chart for the 64 positions of an eight by eight matrix in which the individual spots are subjected to co-deposition and multi-layer deposition from the various plasma guns.

FIG. 8B is a further partial view of the programing martix chart of FIG. 8A completing the chart.

FIG. 9 is a programming matrix for the four positions in a multi-layer deposition example.

FIG. 10 is a matrix for single layer co-deposition for sixteen substrate positions.

FIG. 11 and FIG. 12 illustrate calibration methodology used in conjunction with the invention. For ternary alloys, a calculated table of expected deposits based on single gun experimental rate is shown in FIG. 11; an EDX analysis of the films deposited comparing calculated with actual values is shown in FIG. 12.

DETAILED DESCRIPTION OF THE INVENTION

In brief, the invention is an infinitely variable physical vapor deposition matrix system that allows the fabrication of multiple combinatorial catalyst samples, by the co-deposition of multiple materials or the sequential layer by layer deposition of multiple catalyst constituents. Using the system of the invention, the optimum mix or combination of materials for a pre-determined application can be determined by subsequent testing and evaluation of the samples produced. A high throughput method that foreshortens the time for catalyst materials discovery is described.

A proper catalyst material for a predetermined application, process or processor, may be a co-deposition of discrete materials, or a multi-layered composition formed from multiple constituents sequentially deposited on a substrate or a combination of both. The identification or discovery of such a catalyst composition from among an almost limitless number of co-deposited and/or layered combinations and permutations of potential candidates is facilitated by the method herein. Once a group of potentially promising catalyst constituents is identified and selected, the order in layers of discrete materials is determined; a range of co-deposition component percentages, if applicable, is estimated; and an array of multiple, each differently mixtured or configured, compositions is designed for PVD synthesis—all at essentially the same time—in a group—by the system of the invention. Each synthesized material within the group of resulting catalyst samples may then be evaluated for suitability for the specific application for which a catalyst is intended.

Figure 1:
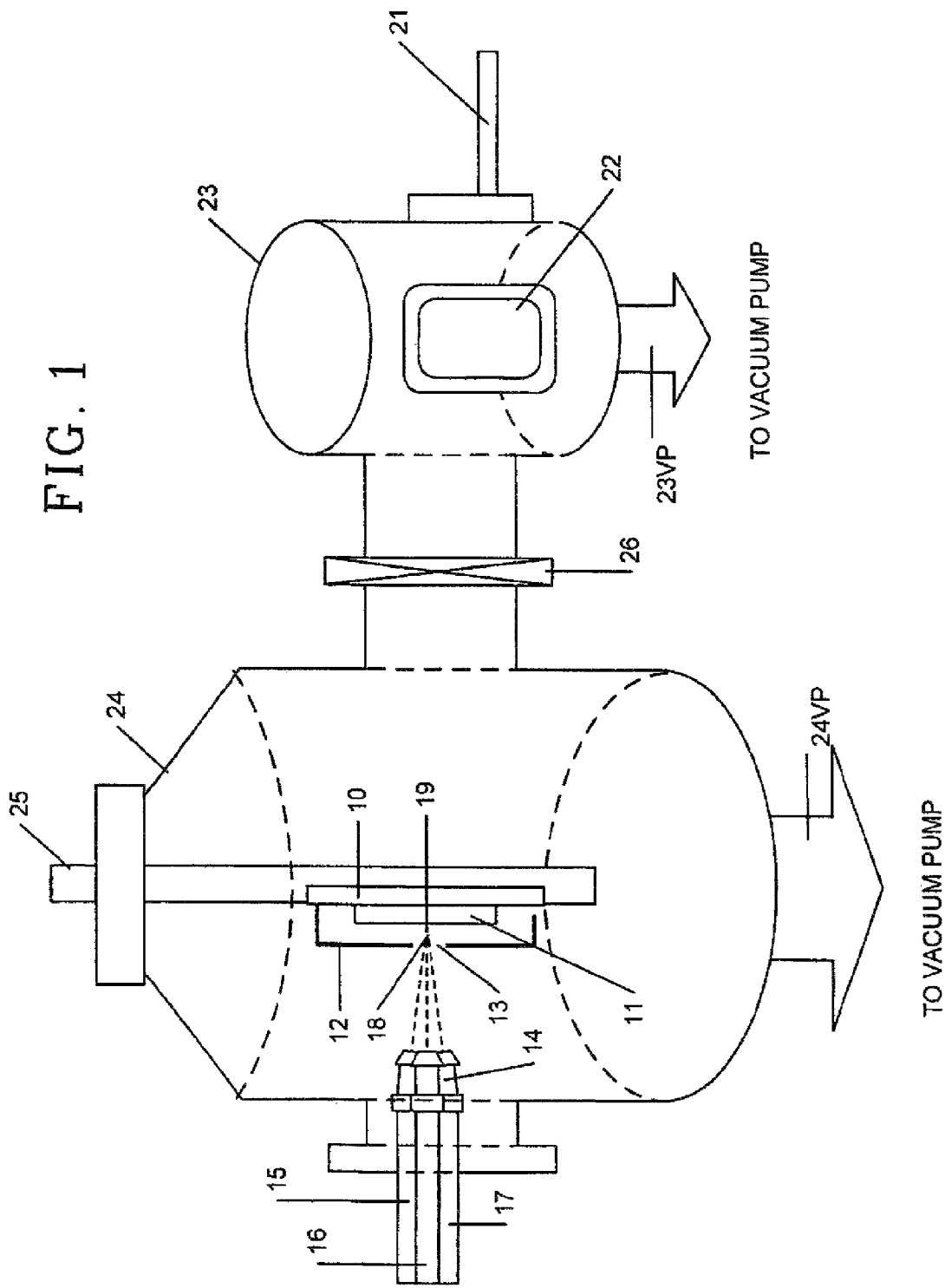
FIG. 1 shows, in a side cross section, a physical vapor deposition apparatus, including a load lock chamber, also used as pre- and post-treatment chamber, and a processing chamber, showing, for simplicity, a single plasma gun cluster therein.

FIG. 1 shows in a side cross section a physical vapor deposition system including a linear rack and pinion (LRP) substrate transfer device 21 that transfers a substrate or substrate holder from the load lock chamber (also used as pre- and post-treatment chamber) 23 which is secured from the ambient outside environment. A vacuum is induced in chamber 23 by means of vacuum pump 23VP. In the pre-treatment chamber, the samples or substrate to be subject to the PVD process are pre-cleaned by plasma (RF) and can be post treated by heating up to 600° C. either in vacuum or under defined gas atmosphere. Impurities are removed by surface plasma cleaning. The samples, or substrate, continue on the track from pre-treatment chamber 23 through intermediate isolation door or valve 26 into PVD chamber 24. The PVD chamber 24 is a vacuum environment induced by vacuum pump 24VP and is otherwise configured as is conventionally appropriate for physical vapor deposition processes. Chamber 24 includes more than one multiple group, cluster, or arrays of plasma guns 15, 16 and 17 directed toward a substrate assembly 10, preceded by mask 12 having opening 13. For clarity, in the side view of FIG. 1, only one gun cluster 14 is shown. Substrate assembly 10 is fixed on shaft 25 which is centrally positioned within the chamber; assembly 10 is rotatable about the axis of the chamber center such that the surface of the substrate mounted thereon may be relatively aligned in position with respect to each plasma gun cluster in the chamber. Assembly 10 is moveable in an x-y plane within the chamber with respect to shaft 25 and/or plasma gun array 14; and may include a planar single extended substrate or may comprise a holder for a plurality of discrete substrates (or electrodes). As the substrate assembly 10 is aligned facing plasma gun array 14, the plasma beam 18 passes through mask opening 13 and deposits a pre-programmed mixture or proportion of materials, (co-deposition or sequential layers) upon a pre-determined discrete area on a planar substrate, or an electrode sample 19, defined with respect to the substrate surface or sample holder 11. X-Y movement of the substrate 11 is controlled by appropriately programming locations in a x-y table included in assembly 10.

In FIG. 2, a plan view of a three array multiple gun physical vapor deposition system 20 is shown. The centrally disposed and controllable substrate assembly 10 bearing substrate 11 is shown centrally disposed on a shaft or other rotator mechanism 25 within the deposition chamber such that the mounted assembly 10 can rotate about an axis into position with respect to each plasma gun array in the chamber. Three such radially spaced apart plasma gun arrays 31, 32 and 33 comprising gun arrays 14A, 14B and 14C are shown. Access valve 34 permits access to the chamber, either directly or in conjunction with a track and a load lock chamber (not shown in FIG. 2). FIG. 3 is a front view of a single cluster of four multiple plasma deposition guns 30A, 30B 30C and 30D, such as each is disposed at positions 31, 32 and 33 radially around the perimeter of the chamber. The plasma stream of each gun is co-focused essentially to the same area on substrate 11, assembly 10 in an embodiment of the invention.

In an example of operation of the system, the relative radial position of the substrate 11 with respect to gun positions, namely position 14A, 14B or 14C, is controlled by an appropriate programming and control means. Once the substrate is aligned in position with respect to a gun array, a predetermined area or electrode on the substrate or holder is aligned with respect to the opening in the mask 12 by a programmed positioning of the substrate with respect to an x-y axis by the x-y table mounted on the rotator. The rate or quantity of material deposition with respect to a specific area on the substrate in determined by controlling the shutter, power and other operating parameters of the individual guns.

Figure 4:
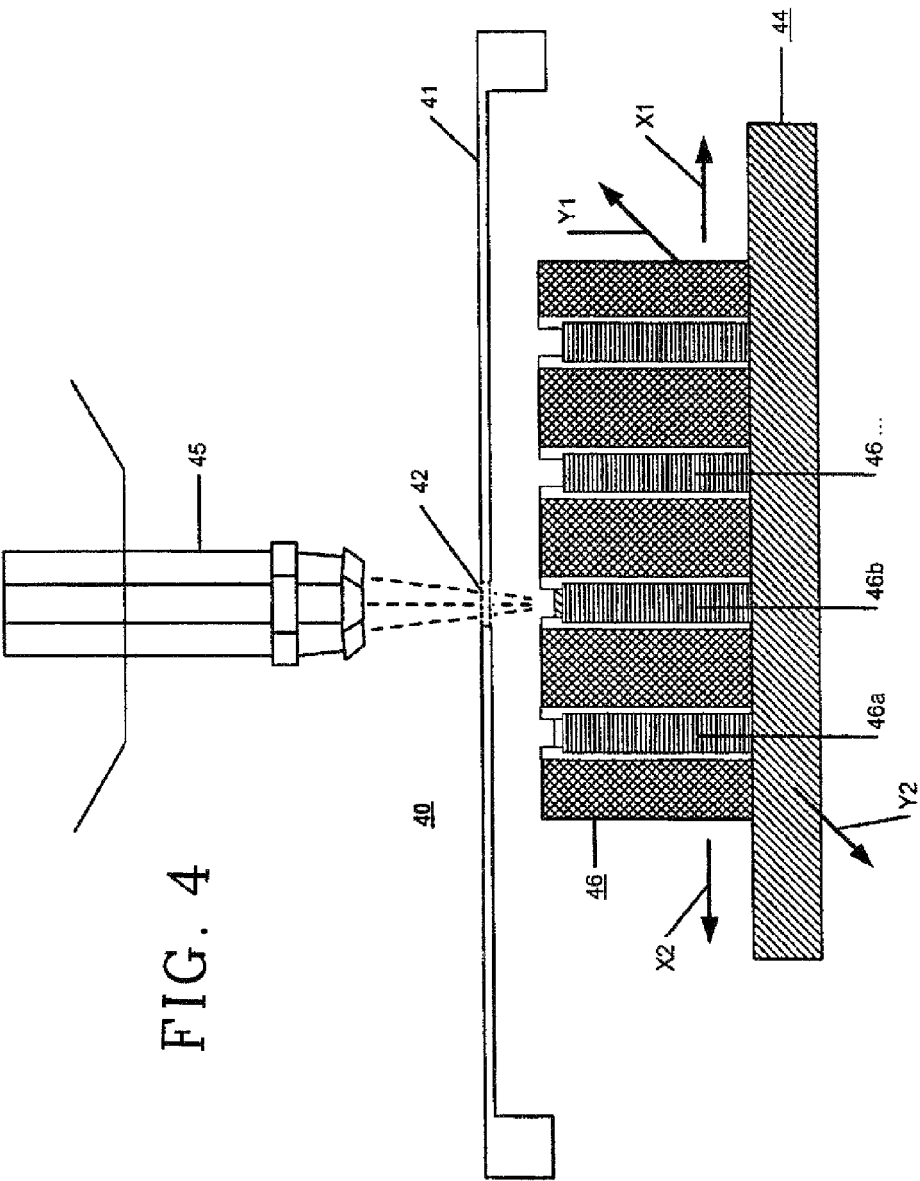
FIG. 4 is a detail side view of a substrate block assembly that may be utilized in the PVD chamber in which separate, multiple substrate samples (or electrodes) are maintained in a substrate block; each sample may be oriented with respect to the plasma beam, a mask and a moveable x-y table.

Controllable substrate assembly or substrate holder assembly 40 is shown in FIG. 4 in a detail side view. As referred to in the context of a holding block, substrate holder 46 refers alternatively to a device for positioning a "substrate" which may be 1) an individual sample element electrode maintained in an array in a block or holder, such as 46a, 46b and 46n, on which candidate materials are deposited or 2) different predetermined spot areas defined on a same plane of a single substrate or affixed to a holder in a matrix. In either event, the holder is affixed to support plate of an x-y table 44 of the rotating target assembly. Mask 41 having orifice 42 is interposed between the holding block 46 and ion gun array 45. The relative positions of the substrate sample elements 46a, 46b and 46n maintained in the block, the mask 41 is moveable either away from the holding block during the XY-table on moving, or close to the holding block during the deposition. Typically, the plasma guns are fixed at radial positions at the perimeter of the PVD chamber. Holding block 46 and support plate 44 may be fixed or moveable with respect to one another, dependent upon the relationship of each to an x-y table, the perpendicular directional movement of which is shown by arrows X1 and X2 and Y1 and Y2.

Figure 5:
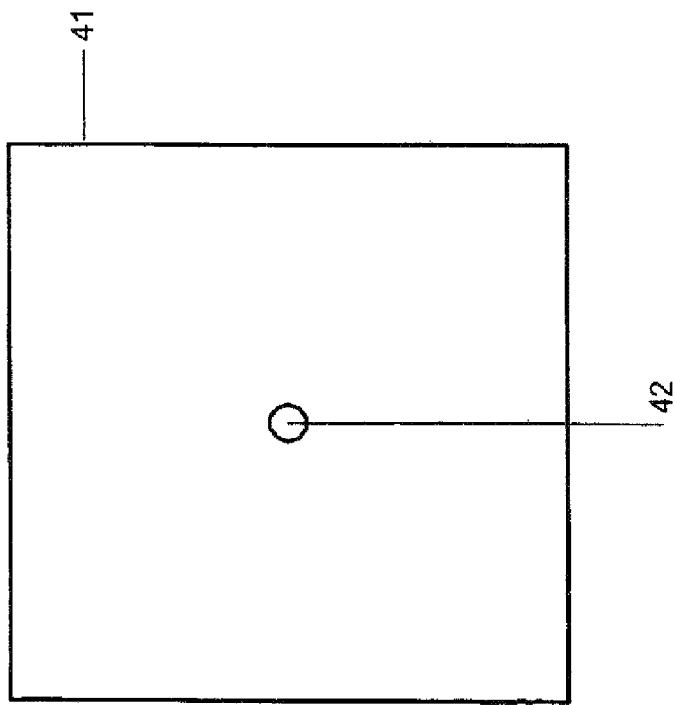
FIG. 5 shows in plan view an example of a mask interposed between the plasma gun and the substrate or substrate block.

FIG. 5 shows mask 41 in plan view having opening 42 as an example. The mask opening may be in a shape and size determined by the system operator; and the mask may include more than one opening.

Figure 6:
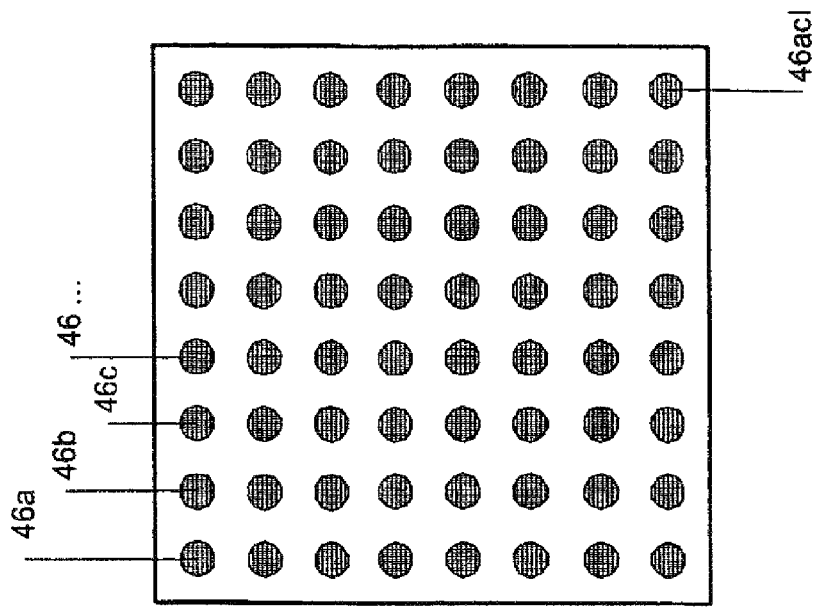
FIG. 6 is a plan view of multiple coating spots. The coating spots may be either 1) different pre determined areas defined on the surface of a single planar substrate or 2) an array of separate, multiple substrates (or electrodes) maintained as a group in a substrate block assembly such as shown in FIG. 4.

FIG. 6 illustrates, in a plan view from the top, an 8 element by 8 element array of substrate deposition spots intended to be exposed to programmed plasma beams and their respective material constituents. In the array, 64 individual positions are identified as 46a, 46b, 46c, 46 . . . to 46acl; each position may correspond to an electrode mounted in a holding block, or a specified spot area identified on a single planar substrate. In either event, the positions of the substrate identified in the array are each individually exposed to plasma from one or more guns in the chamber, by controlling the position of the holder, and consequently, a specific area on the substrate, with respect to the fixed mask and plasma beam[s] by appropriately programming the locations on the x-y table on which the holder/substrate is mounted.

Figure 7:
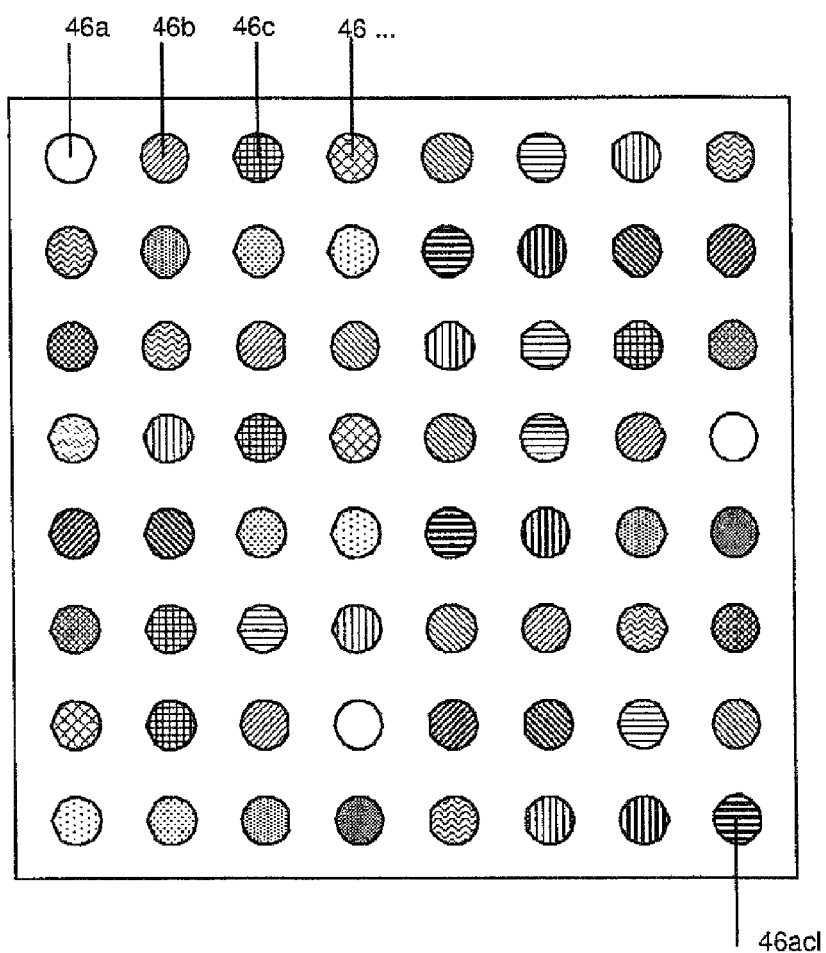
FIG. 7 is a plan view of the coated spots at the different discrete areas of the substrate, or the different substrates (or electrodes) in the substrate block, as the constituents of the multiple spots, having different constituent elements determined by the system programming, are created by a PVD process in accordance with the invention.

FIG. 7 illustrates a substrate after deposition treatment in the system of the invention. Each of the 64 individual spots or electrodes, namely 46a, 46b, 46c 46 . . . through 46acl, has deposited thereon a different co-deposition or layer sequence as determined by the programming and control means of the invention.

Figure 8A:
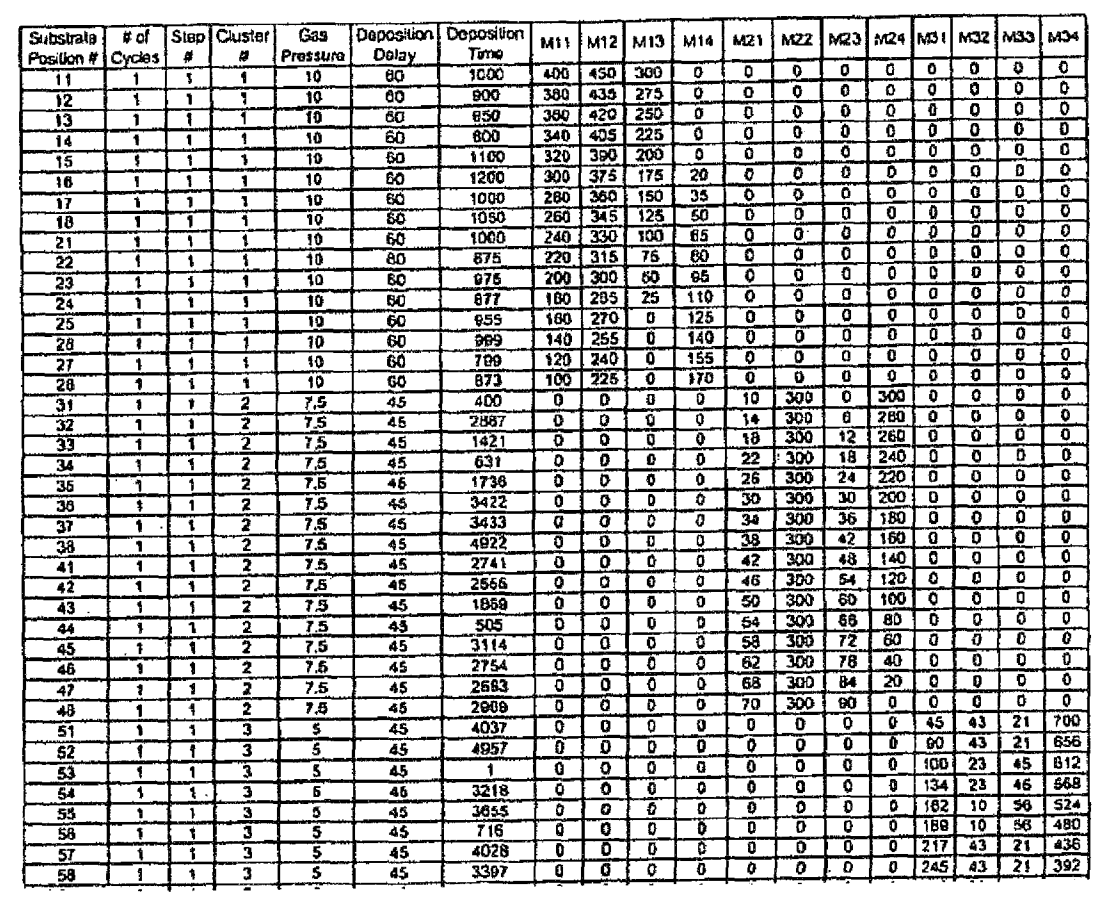
Figure 8B:
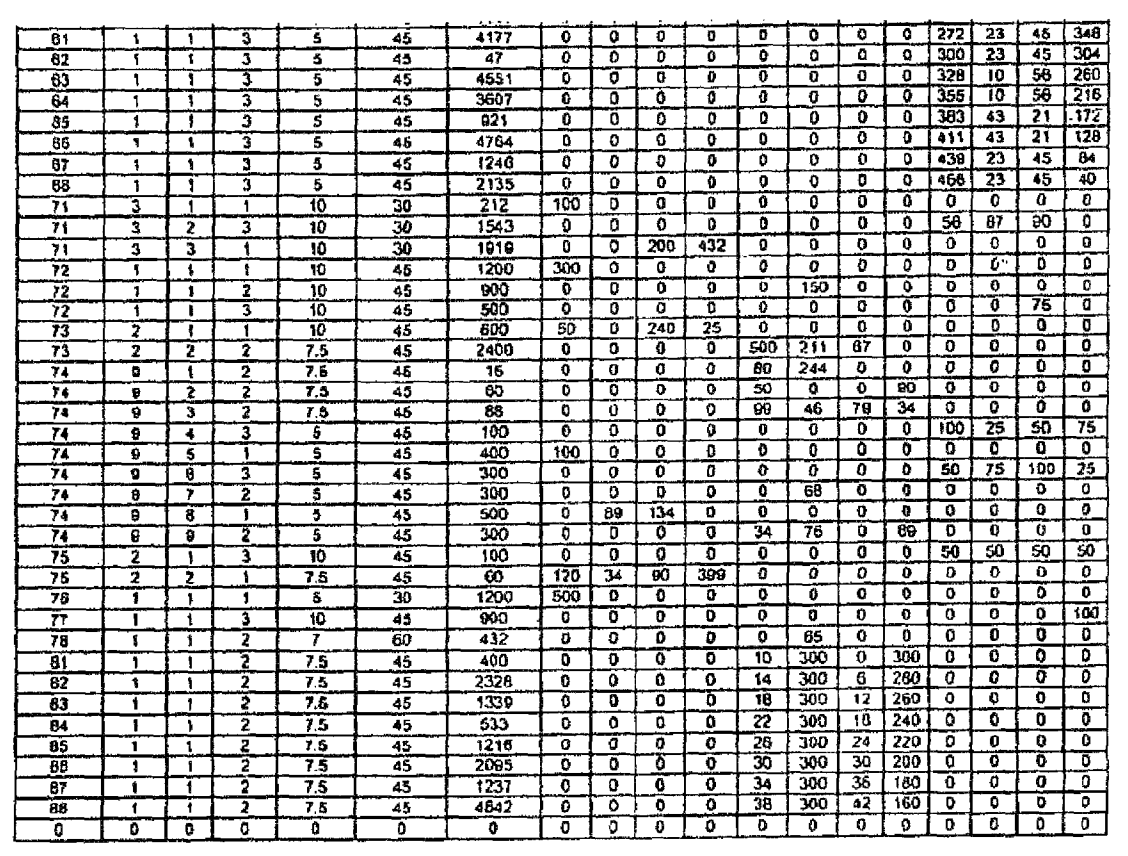

In the operation of the system, the predetermined spot or coating areas of the substrate are each directed to a specified plasma beam by movement of the substrate in three directions: 1) rotationally, such that the specified spot is aligned with the mask and plasma beam from a cluster positioned at the perimeter of the chamber; and 2) vertically and 3) horizontally by the x-y table such that the spot within the substrate target matrix is aligned with the mask and plasma beam. Programming the coordinates of the rotational, vertical and horizontal position of the target spot is in accordance with the skill of the positional programming art and will typically use a graphical user interface for operator convenience. FIGS. 8A and 8B show a programming matrix for the 64 positions of an eight by eight matrix in which the individual target spots are subjected to co-deposition and multi-layer deposition from the various plasma guns. FIG. 9 is a programming matrix for four positions in a multi-layer deposition example, and FIG. 10 is a programming matrix for sixteen positions. In FIGS. 8A, 8B, 9 and 10, the legends identifying the columns indicated represent the following:

TABLE I

| | |
|---|---|
| Substrate Position #: | Substrate position number, column 1 to column 8 and row 1 to row 8, 64 possible positions correlating to the X-Y position of a coating spot. |
| # of cycles: | Number of coating cycles for a multiple deposition sample at a given position. |
| Step #: | Coating step within a processing cycle. |
| Cluster #: | Identification of the plasma gun cluster, 1, 2, or 3, used during deposition step. The substrate assembly will be rotated automatically to face the cluster indicated. |
| Gas Pressure: | Gas pressure, PVD deposition pressure (mTorr). |
| Deposition Delay: | Deposition delay, the time between target on and shutter open in seconds for an individual gun within a cluster. |
| Deposition time: | The time in seconds that the shutters on an individual plasma gun are open; the actual time of material deposition on the substrate. |
| Material position M CP: | For the plasma material associated with each gun in a cluster, the input power in Watts associated with a deposition at the specified position. |

In the programming matrix shown in FIG. 9, the substrate sample at the position 11 includes three total layers with a single metal in each layer; the substrate sample at the position 35 includes four total layers of alternating co-deposited ternary alloys; the substrate sample at the position 87 is programmed with nine cycles to deposit 81 total layers with the composition repeated every tenth layer; and the substrate sample at the position 44 is programmed for four total layers in two cycles to deposit alternating co-deposited quaternary alloys. Similar programming matrices are evident in view of the foregoing, adapted to different sized matrices of spot areas, such as four by four, three by three, etc., single and multiple layer, and single metal and co-depositions. While a record of the deposition on a substrate area, after the PVD processing is maintained, it is preferred to calibrate the apparatus in advance of actual sample production by comparing calculated expected deposition values determined by plasma power, time and composition, with experimental results and analyses of the deposited materials. For ternary alloys, an example of a calibration table is shown in FIG. 11; an EDX analysis of the films deposited comparing calculated with actual values is shown in FIG. 12. In FIG. 11, it was started from single gun experimental deposition rate to estimate the co-deposition rate of, e.g. a ternary alloy PtWV. Then a calibration factor was determined from the estimated and actual rates. Using this calibration factor and the single gun calibration rate as well as by fixing the total plasma power or the total deposition rate, the plasma powers to coat any compositions of the ternary alloy were calculated as shown in the table. Using this methodology, FIG. 12 compares the theoretical composition and actual composition of PtWV alloys of six different atomic ratios, each atomic ratio is repeated using two different total plasma powers. The verification (or not) of expected values assists in determining specific test protocols for the deposition of a selected group of materials upon a particular matrix, in contrast with ad hoc speculation about anticipated deposition results, thus reducing overall evaluation time for a particular testing group sequence of hundreds, or thousands, or more, of materials and combinations.

Figure 13:
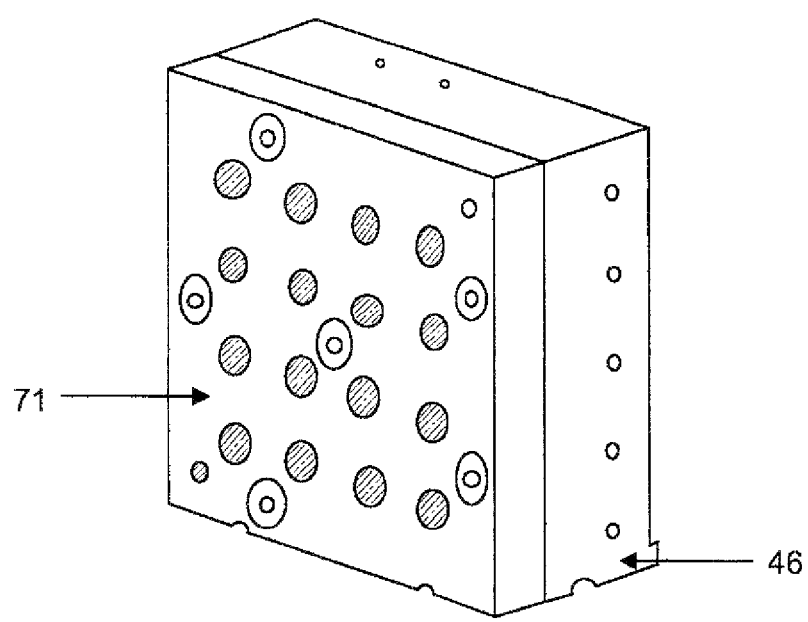
FIG. 13 and FIG. 14 are respectively a perspective front side view and a front side assembly view of an example of a substrate block holder for maintaining a plurality of substrate samples in the system.
Figure 14:
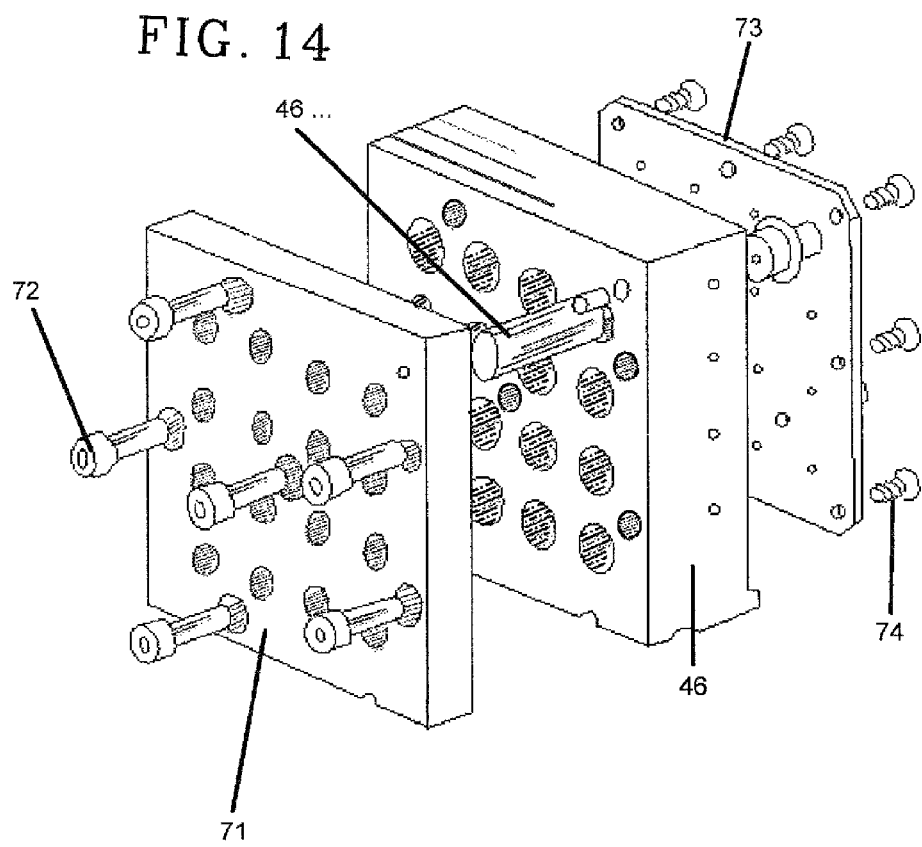

FIG. 13 and FIG. 14 illustrate a substrate holder otherwise identified as 46 in the drawings. The assembly 46 in FIG. 13 includes holder block 46, front face 71 and back retainer 73. In the assembly view of FIG. 14, screws or fasteners 72 maintain the front face secured to the holder block 46. Openings in a matrix corresponding to the arrangement of samples 46 . . . 46n in the block are included in the face plate essentially concentric with the sample arrangement; typically the openings are sized in diameter less than that the diameter of the samples, securing the samples in the block. The openings may include an inset from the upper face of the sample and a surface chamfer, thus acting as a second mask directing the plasma beam in the deposition process. Back retainer 73 of the bock is secured to the holder block by screws or fasteners 74.

In general, the apparatus and system allows expedited research and testing of numerous samples of potentially promising combinatorial catalyst compositions. The apparatus allows the high throughput coating in a batch of predetermined multiple areas, or spots, on a wafer surface or array of substrate samples maintained in a substrate holder. Co-deposition of binary, ternary and quaternary systems and materials is effected in batch synthesis PVD processing. With twelve guns in three clusters, the apparatus is capable of depositing three quaternary systems, twelve ternary systems; eighteen binary systems by means of co-deposition; any combination of twelve materials in a layer-by-layer deposition; and co-deposition combinations of the foregoing. By changing one or more of the shape, size, and number of orifices in a fixed mask, the apparatus is adaptable to coat more than one substrate or spot area by the process above.

Suitably configured mechanically with a central rotator and x-y table and appropriately programmed, and with each target group having four guns co-focusing to the substrate, the substrate can rotate—from any one—to any one other—of the three alternate plasma gun cluster positions within a few seconds with full automatic control of the PVD processing of the multiple samples. In addition, the target information may be saved through menu input, for example, Target 11=Pt; Target 12=Au; Target 13=Ag; Target 14=Rh; Target 21, etc., Saving the position of the X-Y table records each position of the substrate, namely the substrate coating areas, for example, as shown in FIG. 6. In the GUI menu interface, the criteria of identified coating spots; X-Y table position; material and cluster; substrate rotation direction; plasma power; vacuum; and deposition characteristics may be specified and recorded. In an example, the plasma deposition menu, may in a sequence: 1) specify targets T11 . . . T14 "ON" with powers of 50 Watts; 2) move S11 to the open mask for 10 seconds; 3) specify targets T21 . . . T24 "ON" with powers of 125 Watts; and 4) return in a cycle, go to step 1.

Thus, in the example described, the apparatus includes a loading lock, pre-cleaning by plasma (RF), post-treatment by heating up to 600° C.; removal of impurities by surface treatment; sufficient view ports for future use or adaptation to differently configured plasma gun cluster configurations other than the example of twelve guns in three groups. The number of guns in a cluster and the number of clusters may be modified; the number of spot areas in a substrate may be varied; and their geometric arrangement is changeable. A program controlled, accurate X-Y table and a flexible mask are preferred. In a testing sequence for catalyst synthesis, the substrate or holder with substrates thereon, is positioned in the load lock for pre-cleaning, transferred to the plasma gun chamber, and subjected to post-treatment by temperature or a film protection. Beginning with a material concept, the deposition characteristics of the materials are associated in a calibration file for specified rate, power, and pressure values and coating parameters are set in a batch or group test file. The control system for the rotator and x-y table, commercially available, is loaded, and then the combi-materials are subjected to the appropriate characterization test for suitability in a specified application.

As the components are operatively interrelated in accordance with the invention, the system provides a plurality of combinatorial catalyst materials for subsequent testing. Thus, in a physical vapor deposition apparatus including a sealable chamber having an access valve, the chamber includes a plurality of separately controllable plasma sources of different materials and a holder for a substrate or plurality of substrates to which the plasma guns are directed. The substrates is controllably positionable within the chamber such that any defined spot on the substrate, or sample in a holder, is capable of being aligned with respect to each of the plurality of plasma sources. Each of the plurality of plasma sources is positioned within the chamber angularly separated radially from each other with respect to the center of a perimeter defined by a fixed point about which the holder rotates; and each of the plurality of plasma sources is positioned within the chamber such that the source may be focused on the substrate.

In achieving high throughput using a programmable x-y table to control position of the substrate holder, and consequently the position of individual substrate samples, or spot sampling areas thereon, columns and rows of sample areas should preferably be arranged in a matrix. For example, the number of sample areas in rows may equal the number of sample areas in columns: 3×3; 4×4; 6×6; 8×8; etc. Alternatively, the electrodes in the columns and rows may be staggered, for example, 3-4-3-4; 8-7-8-7-8-7-8, in an order in which the relationship of the number of sample areas in one column to the number of sample areas in an adjacent column is: sample areas in row N=X; sample areas in row N+1=X+1; or sample areas in column N=X; sample areas in column N+1=X+1. As long as positions of the sample spot areas on the substrate surface are programmable, the specific matrix arrangement is discretionary with the test protocol designer.

Utilizing the control system interrelating the operation of the plasma guns in the clusters with respect to the target substrate areas, separately controllable plasma sources can be programmed such that the plasma materials are deposited either as a layer-by-layer deposition or in a co-deposition relationship, or both. Means for controlling the plasma sources of includes one or more than one of at least: 1) a means for selecting a plasma source within a cluster and a means for controlling the operation of the source, such as a shutter, and power control with respect to the operation of a specified plasma gun directed toward the position of a substrate target area.

Having described the invention in detail, those skilled in the art will appreciate that, given the present disclosure, modifications may be made to the invention without departing from the spirit of the inventive concept herein described. Therefore, it is not intended that the scope of the invention be limited to the specific and preferred embodiments illustrations as described. Rather, it is intended that the scope of the invention be determined by the appended claims.

What is claimed is:

1. A physical vapor deposition system for depositing combinatorial catalyst samples on a plurality of substrate target areas comprising:

(a) a deposition chamber that when open, receives one or more substrates and is sealable after the one or more substrates are loaded therein, the chamber being openable after the one or more substrates have been is processed so that the one or more substrates with can be removed therefrom;

(b) a plurality of plasma sources radially disposed within the chamber for depositing catalyst samples on the target areas of the one or more substrates, wherein each of the plasma sources comprises a cluster of separately controllable, co-focused plasma guns for directing a plasma stream of material in a predetermined radially inward direction toward a substrate target area located within the deposition chamber, each gun of a cluster configured for depositing a predetermined catalyst material onto the substrate target area, the substrate target area capable of being moved into alignment with the cluster;

(c) a substrate assembly for controllably and selectively positioning an array of substrate deposition spots arranged in a uniform grid on the substrate assembly, the deposition spots defining one or more target areas on at least one substrate within the deposition chamber in order to selectively and sequentially align each of the target areas of the one or more substrates with one of said clusters of plasma guns, said substrate assembly being rotationally movable about an axis that is offset from the substrate assembly and substantially perpendicular to the predetermined direction of the plasma streams and planarly moveable within the deposition chamber in mutually perpendicular directions, one of which is perpendicular to the predetermined radially inward direction of the plasma streams for successively aligning each of the target areas with at least one cluster of plasma guns, whereby movement of the substrate assembly in the mutually perpendicularly directions aligns the at least one cluster of plasma guns with a different target area; and (d) a control system programmably controlling the operation of each gun and the movement of the substrate assembly for alignment of the target areas with the clusters of plasma guns, the control system controlling (i) the amount of power to each gun to regulate a rate of catalyst material deposition, (ii) the amount of time of deposition for each catalyst material to be deposited on a target area, (iii) rotational movement of the substrate assembly in order to align the substrate assembly with one of the radially disposed clusters of plasma guns, and (iv) planarly movement of the substrate assembly, in both x and y directions, in order to align an individual target area of a substrate with the same cluster of plasma guns such that the plasma guns of that cluster are co-focused on the aligned target area.

2. The system of claim 1 in which the control system includes inputted parameters, the parameters determining for each target area, the amount of power, the amount of time, and the characteristics of the catalyst sample to be deposited.

3. The system of claim 1 in which the substrate assembly is configured for bearing a planar substrate having a plurality of target areas thereon arranged in a matrix defined by columns and rows.

4. The system of claim 3 wherein the matrix comprises an equal number of columns and rows of target areas.

5. The system of claim 3 in which the relationship of the number of separately defined target areas in one column to the number of separately defined target areas in an adjacent column is: target areas in column N=X and target areas in adjacent column N+1=X+1.

6. The system of claim 3 in which the relationship of the number of separately defined target areas in one row (N) to the number of separately defined target areas in an adjacent row is: target areas in row N=X and target areas in adjacent row N−1=X−1.

7. The system of claim 1 wherein the substrate assembly comprises a block configured for maintaining a plurality of cylindrical substrate elements, each cylindrical substrate element individually defining a target area, the cylindrical substrate elements maintained in an array of columns and rows formed within the block, in which upper surfaces of the cylindrical substrate elements comprise the target areas on which catalyst samples are deposited.

8. The system of claim 7 in which the cylindrical substrate elements are inset within the block in the matrix and a plate having a plate matrix of openings concentric with the matrix of elements in the block is applied facing the surface of the block, such that the openings in the plate are aligned with the elements and a cross-section area of an opening in the plate is less than a cross-section area of the surface of the corresponding concentric cylindrical element.

9. The system of claim 1 in which, the control system is configured to select 1) an ion emitted by each plasma gun within a cluster; 2) the amount of power and the duration of operation for the gun; and 3) the position of the substrate assembly, such that each target area is exposed to the plasma gun at the selected power and at the selected duration.

10. The system of claim 1 wherein catalyst materials are deposited on the target areas in layers in a programmed number of cycles.

11. The system of claim 1 wherein values from an actual sample catalyst material created at a set power, time and composition are compared to expected values and the programmed parameters for power, time and composition for that catalyst material are adjusted if the actual catalyst material values vary from the expected values.

12. The system of claim 1 in which the control system positions the substrate assembly and selects certain plasma guns and controls the amount of power and the duration of operation of the guns in essentially the same operation such that different catalyst materials from each gun are co-deposited with respect to a given target area on the substrate.

13. The system of claim 1 in which the control system positions the substrate assembly and selects certain plasma guns and controls the amount of power and the duration of operation of the guns in essentially the same operation such that different catalyst materials from each gun are deposited as layers with respect to each target area on the substrate.

14. The system of claim 1 in which the control system positions the substrate assembly, selects the guns, and controls the amount of power and the duration of operation of the guns, such that different catalyst materials from the guns are applied to a given target area in at least one of a layer or a co-deposition.

15. The system of claim 14 wherein each of the catalyst materials is a metal and the control system is configured for depositing catalyst samples comprising multiple layers with a single metal in each layer.

16. The system of claim 14 wherein the control system is configured for co-depositing catalyst materials to form ternary alloys.

17. The system of claim 14 wherein the control system is configured for co-depositing alternating layers of quaternary alloys.

18. The system of claim 1 wherein the substrate assembly is planarly movable within the deposition chamber in mutually perpendicular directions that are both perpendicular to the predetermined radially inward direction of the plasma streams.

* * * * *